United States Patent
Forejt et al.

(10) Patent No.: US 8,008,969 B1
(45) Date of Patent: Aug. 30, 2011

(54) SINGLE SUPPLY CLASS-D AMPLIFIER

(75) Inventors: Brett E. Forejt, Garland, TX (US); David J. Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/750,494

(22) Filed: Mar. 30, 2010

(51) Int. Cl.
  *H03F 3/38* (2006.01)
(52) U.S. Cl. ........ 330/10; 330/251; 330/207 A; 330/302
(58) Field of Classification Search ............... 330/10, 330/251, 207 A, 302
  See application file for complete search history.

(56) References Cited

U.S. PATENT DOCUMENTS

| | | | |
|---|---|---|---|
| 5,963,086 A * | 10/1999 | Hall ................................ | 330/10 |
| 6,320,460 B1 | 11/2001 | Meszlenyi | |
| 6,753,729 B2 | 6/2004 | Broadley | |
| 7,279,964 B2 * | 10/2007 | Bolz et al. .................... | 330/10 |
| 7,330,069 B2 | 2/2008 | Yamamura et al. | |
| 7,400,191 B2 | 7/2008 | Rodriguez | |
| 7,551,028 B1 * | 6/2009 | Cyrusian .................... | 330/251 |
| 7,633,336 B2 * | 12/2009 | Bean et al. .................. | 330/10 |
| 7,800,437 B2 * | 9/2010 | Khoury et al. ............... | 330/10 |
| 7,859,331 B2 * | 12/2010 | Beale et al. .................. | 330/10 |

* cited by examiner

*Primary Examiner* — Patricia Nguyen
(74) *Attorney, Agent, or Firm* — John J. Patti; Wade J. Brady, III; Frederick J. Telecky, Jr.

(57) ABSTRACT

Traditionally, switching amplifiers (i.e., class-D and class-G) with negative supply rails had issues with direct current (DC) power loss, included large external capacitors, had a comparative reduction in efficiency, and oftentimes included separate power management circuits. Here, a class-D amplifier is provided with an output stage that provides negative supply voltages, positive supply voltages, and ground. Essentially, this amplifier provides some of the benefits of the conventional amplifiers without the drawbacks.

13 Claims, 2 Drawing Sheets

SINGLE SUPPLY CLASS-D AMPLIFIER

TECHNICAL FIELD

The invention relates generally to a class-D amplifier and, more particularly, to a class-D amplifier that uses a signal supply.

BACKGROUND

Currently, Texas Instruments Incorporated (TI) offers a number of audio amplifiers that a include DIRECTPATH™ architecture. Some features of this architecture are that an output direct current or DC blocking capacitor is not needed and that there is a negative supply rail. An example is TI's TPA6140A2, which is a class-G amplifier that uses a charge pump to invert the voltage (from a positive supply) to create a negative supply voltage so that the headphone amplifier output can be centered at 0V without the need for DC blocking capacitors. However, there are some tradeoffs associated with this architecture; namely, supplying a negative supply voltage requires several external components as well as it reduces efficiency. Additionally, these types of devices may have also need to have separate power management circuits (i.e., buck converters). Therefore, there is a need for a method or an apparatus that offers similar advantages without the drawbacks.

Some other conventional circuits are: U.S. Pat. No. 6,320,460; U.S. Pat. No. 6,753,729; U.S. Pat. No. 7,330,069; and U.S. Pat. No. 7,400,191.

SUMMARY

A preferred embodiment of the present invention, accordingly, provides an apparatus. The apparatus comprises an integrator that receives an input signal; a pulse width modulator (PWM) that is coupled to the integrator; a logic circuit coupled to the PWM; and an output stage having: a first node; a second node; a third node; a fourth node that is coupled to ground; a capacitor that is coupled between the first and second nodes; and a switch network that is coupled to the first node, the second node, the third node, the fourth node, and a supply rail, wherein the switch network is controlled by logic circuit so as to operate in first mode, a second mode, and a third mode, and wherein, in the first mode, the voltage supply charges the capacitor and the third node is grounded, and wherein, in the second mode, the capacitor provides a positive supply voltage to the third node, and wherein, in the third mode, the capacitor provides a negative supply voltage in the third mode.

In accordance with a preferred embodiment of the present invention, the switch network further comprises: a first switch that is coupled between the supply rail and the first node, wherein the first switch is closed in the first mode; a second switch that is coupled between the first node and the fourth node, wherein the second switch is closed in the third mode; a third switch that is coupled between the first node and the third node, wherein the third switch is closed in the second mode; a fourth switch that is coupled between the second node and the fourth node, wherein the fourth switch is closed in the first mode and the second mode; a fifth switch that is coupled between the second node and the fourth node, wherein the fifth switch is closed in the third mode; and a sixth switch that is coupled between the third node and the fourth node, wherein the sixth switch is closed in the first mode.

In accordance with a preferred embodiment of the present invention, the input signal is differential.

In accordance with a preferred embodiment of the present invention, the integrator further comprises: an amplifier having a first input terminal, a second input terminal, a first output terminal, and a second output terminal; and a first feedback capacitor that is coupled between the first input terminal and the first output terminal; and a second feedback capacitor that is coupled between the second input terminal and the second output terminal.

In accordance with a preferred embodiment of the present invention, the PWM further comprises: a first comparator having a first input terminal, a second input terminal, and an output terminal, wherein the first input terminal of the first comparator is coupled to the integrator, and wherein the output terminal of the first comparator is coupled to the logic circuit; a second comparator having a first input terminal, a second input terminal, and an output terminal, wherein the first input terminal of the second comparator is coupled to the integrator, and wherein the output terminal of the second comparator is coupled to the logic circuit; and a ramp generator that is coupled to the second input terminal of the first comparator and the second input terminal of the second comparator.

In accordance with a preferred embodiment of the present invention, an apparatus is provided. The apparatus comprises an audio source that generates an audio signal; a class-D amplifier having: a first capacitor that is coupled to the audio source so as to receive the audio signal; an integrator is coupled to the first capacitor; a pulse width modulator (PWM) that is coupled to the integrator; a logic circuit coupled to the PWM; and an output stage having: a first node; a second node; a third node; a fourth node that is coupled to ground; a capacitor that is coupled between the first and second nodes; and a switch network that is coupled to the first node, the second node, the third node, the fourth node, and a supply rail, wherein the switch network is controlled by logic circuit so as to operate in first mode, a second mode, and a third mode, and wherein, in the first mode, the voltage supply charges the capacitor and the third node is grounded, and wherein, in the second mode, the capacitor provides a positive supply voltage to the third node, and wherein, in the third mode, the capacitor provides a negative supply voltage in the third mode; and a speaker that is coupled to the third node.

In accordance with a preferred embodiment of the present invention, an apparatus is provided. The apparatus comprises a supply rail; a first node; a second node; a third node; a fourth node that is coupled to ground; a first direct current (DC) blocking capacitor that receives a first portion of an input signal; a second DC blocking capacitor that receives a second portion of the input signal; an amplifier having a first input terminal, a second input terminal, a first output terminal, and a second output terminal, wherein the first input terminal of the amplifier is coupled to the first DC blocking capacitor, and wherein the second input terminal of the amplifier is coupled to the second DC blocking capacitor; a first feedback capacitor that is coupled between the first input terminal and the first output terminal; a second feedback capacitor that is coupled between the second input terminal and the second output terminal; a first comparator having a first input terminal, a second input terminal, and an output terminal, wherein the first input terminal of the first comparator is coupled to the first output terminal of the amplifier; a second comparator having a first input terminal, a second input terminal, and an output terminal, wherein the first input terminal of the second comparator is coupled to the second output terminal of the amplifier; a ramp generator that is coupled to the second input terminal of the first comparator and the second input terminal of the second comparator; a logic circuit coupled to the output terminals of the first and second comparators; an output capacitor that is coupled between the first and second nodes; a first switch that is coupled between the supply rail and the first node, wherein the first switch is closed by the logic circuit in a first mode; a second switch that is coupled between the first node and the fourth node, wherein the second switch is closed by the logic circuit in a second mode; a third switch that is coupled between the first node and the third node, wherein the third switch is closed by the logic circuit in a third mode; a fourth switch that is coupled between the second node and the fourth node, wherein the fourth switch is closed by the logic circuit in the first mode and the third mode; a fifth switch that is coupled between the second node and the fourth node, wherein the fifth switch is closed by the logic circuit in the second mode; and a sixth switch that is coupled between the third node and the fourth node, wherein the sixth switch is closed by the logic circuit in the first mode.

In accordance with a preferred embodiment of the present invention, the apparatus further comprises an audio source that is coupled to the first and second DC blocking capacitors so as to provide the input signal.

In accordance with a preferred embodiment of the present invention, the apparatus further comprises a speaker that is coupled to the third node.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
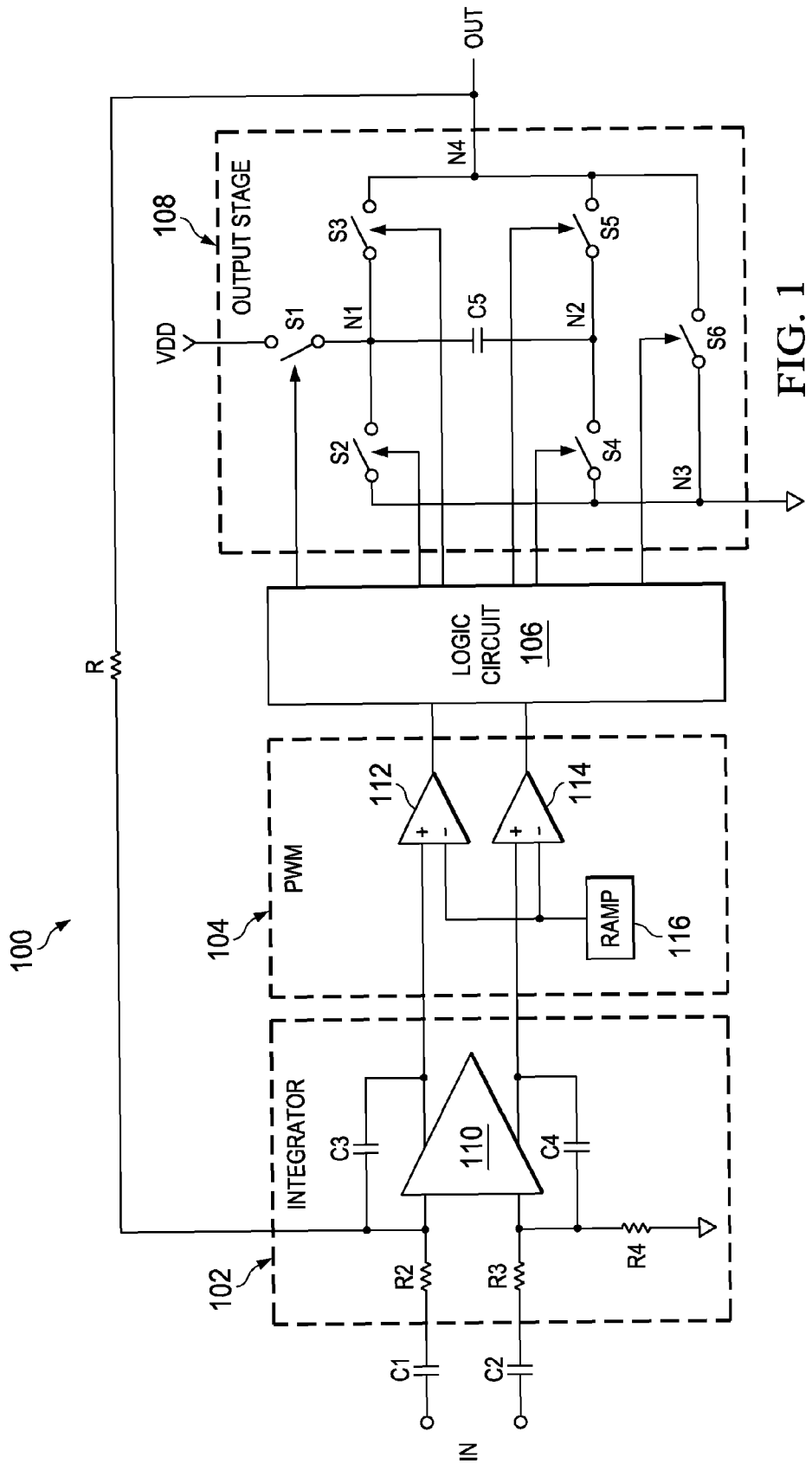
FIG. 1 is a circuit diagram of an example of a class-D amplifier in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an example of a class-D amplifier in accordance with a preferred embodiment of the present invention. Amplifier 100 generally comprises direct current (DC) blocking capacitors C1 and C2, input resistors R2 and R3, an integrator 102, a pulse width modulator (PWM) 104, logic circuit 106, and output stage 108. The integrator 102 generally comprises amplifier 110, feedback capacitors C3 and C4, and resistors R1 and R4 PWM 104 generally comprises comparators 112 and 114 and ramp generator 116, and output stage 108 generally comprises output capacitor C5 (which may be a signal capacitor or multiple capacitors) and switches S1 through S6. Additionally, supply rail VDD is typically coupled to a battery, a cell, or another power source.

In operation, amplifier 100 receives an analog input signal IN and generates an output signal OUT (which generally has values of "0" or ground, "−1" or negative supply voltage, and "+1" or positive supply voltage.) To accomplish this, the input signal IN (which is generally differential, but may also be single ended) is provided to capacitors C1 and C2 and resistors R2 and R3, where capacitors C1 and C2 operate to substantially remove DC components from input signal IN. Additionally, capacitors C1 and C2 are optional components, which are not necessary for amplifier 100 to operate. The integrator 102 then integrates the signal from capacitors C1 and C2 and resistors R1 and R2. Each of comparators 112 and 114 receives a portion of the (differential) integrated signal from integrator 102 and compares its portion to a ramp signal from ramp generator 116. The comparison results from comparators 112 and 114 can then be used by logic circuit 106 to generate control signals for switches S1 through S6.

In particular, there are three modes of operation. In a first mode, logic circuit 106 closes switches S1, S4, and S6, which couples the output node N4 and node N2 to node N3 (which is coupled to ground) and couples node N1 to the supply rail VDD. Thus, output capacitor C5 can be charged to the voltage on supply rail VDD, while a "0" is output from node N4. In a second mode, logic circuit 106 closes switches S3 and S4 to provide a positive supply voltage or "+1" at node N4 because the positive plate of capacitor C5 (plate charged to the voltage on supply rail VDD) is coupled to node N4, while the opposite, negative plate of C5 is coupled to ground. Alternatively, for a second mode, switches S1 and S3 can be closed to provide a positive supply voltage or "+1" at node N4 directly from supply rail VDD. In a third mode, logic circuit 106 closes switches S2 and S5 to provide a negative supply voltage or "−1" to output node N4 because the positive plate of capacitor C5 is coupled to ground while the negative plate of capacitor C5 is coupled to node N4. Alternatively, five switches may be used to accomplish substantially the same result.

As a result of this configuration, large external capacitors (on the order of about 1 μF to about 47 μF) used for conventional circuits to generate a negative rail voltage can be eliminated. Additionally, there is a reduction in the DC power loss, and there is the efficiency in increased over conventional amplifiers. In particular, simulation results show a 40-50% increase over the TI's TPA6140 when delivering 1 mW at 16Ω. Additionally, simulation results have also shown a total harmonic distortion of THD of about 0.2% for about 1 mW delivered at 1 kHz for a supply voltage of 3.6V on rail VDD, and a load resistance of about 32Ω.

There are some limitations, however, with this amplifier 100. Capacitor C5 is not a true voltage source (like a battery or power supply) because it has a relatively short discharge time. This short discharge time limits the output pulse width through node N4, but if the control loop within logic circuit 106 is sufficiently fast and capacitor C5 is sufficiently large, the rapid discharge time of capacitor C5 should not significantly affect performance. For example, using an internal clock frequency of about 1 MHz with a capacitance of about 1 μF is generally sufficient. Additionally, the output duty cycle is generally limited to about 50% because the logic circuit 106 generally converts the simple differential PWM modulation into an SE ternary PWM modulation.

Figure 2:
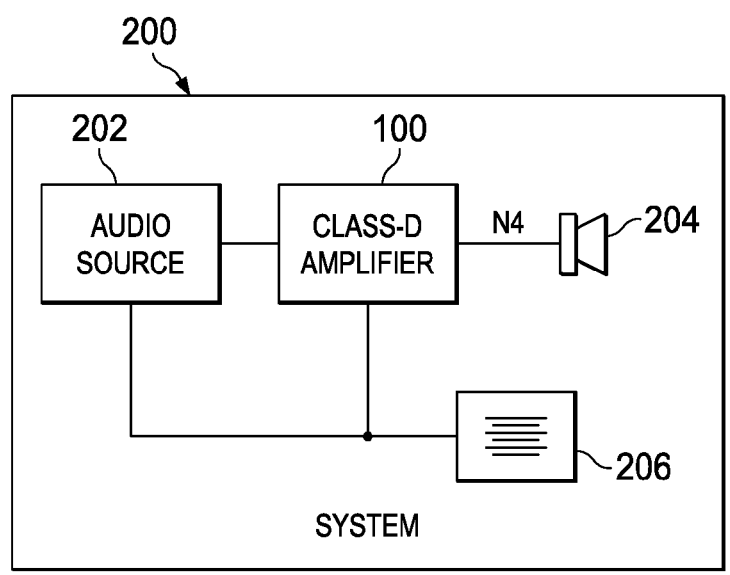
FIG. 2 is a system that employs the class-D amplifier of FIG. 1.

Turning now to FIG. 2, an example of a system 200 that employs amplifier 100 can be seen. Generally, system 200 is a portable media device (i.e., mp3 player) that generates an audio signal from an audio source 202. Amplifier 100 receives this audio signal from source 202 and provides an amplified signal through output N4 to a speaker 204 (i.e., headphones). Each of the audio device 202 and amplifier 100 are powered by an onboard power cell 206 (i.e., battery).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an integrator that receives an input signal;
    a pulse width modulator (PWM) that is coupled to the integrator;
    a logic circuit coupled to the PWM; and
    an output stage having:
        a first node;
        a second node;
        a third node;
        a fourth node that is coupled to ground;
        a capacitor that is coupled between the first and second nodes; and
        a switch network that is coupled to the first node, the second node, the third node, the fourth node, and a supply rail, wherein the switch network is controlled by logic circuit so as to operate in first mode, a second mode, and a third mode, and wherein, in the first mode, the voltage supply charges the capacitor and the third node is grounded, and wherein, in the second mode, the capacitor provides a positive supply voltage to the third node, and wherein, in the third mode, the capacitor provides a negative supply voltage in the third mode.

2. The apparatus of claim 1, wherein the switch network further comprises:
    a first switch that is coupled between the supply rail and the first node, wherein the first switch is closed in the first mode;
    a second switch that is coupled between the first node and the fourth node, wherein the second switch is closed in the third mode;
    a third switch that is coupled between the first node and the third node, wherein the third switch is closed in the second mode;
    a fourth switch that is coupled between the second node and the fourth node, wherein the fourth switch is closed in the first mode and the second mode;
    a fifth switch that is coupled between the second node and the fourth node, wherein the fifth switch is closed in the third mode; and
    a sixth switch that is coupled between the third node and the fourth node, wherein the sixth switch is closed in the first mode.

3. The apparatus of claim 1, wherein the input signal is differential.

4. The apparatus of claim 3, wherein the integrator further comprises:
    an amplifier having a first input terminal, a second input terminal, a first output terminal, and a second output terminal; and
    a first feedback capacitor that is coupled between the first input terminal and the first output terminal; and
    a second feedback capacitor that is coupled between the second input terminal and the second output terminal.

5. The apparatus of claim 1, wherein the PWM further comprises:
    a first comparator having a first input terminal, a second input terminal, and an output terminal, wherein the first input terminal of the first comparator is coupled to the integrator, and wherein the output terminal of the first comparator is coupled to the logic circuit;
    a second comparator having a first input terminal, a second input terminal, and an output terminal, wherein the first input terminal of the second comparator is coupled to the integrator, and wherein the output terminal of the second comparator is coupled to the logic circuit; and
    a ramp generator that is coupled to the second input terminal of the first comparator and the second input terminal of the second comparator.

6. An apparatus comprising:
    an audio source that generates an audio signal;
    a class-D amplifier having:
        a first capacitor that is coupled to the audio source so as to receive the audio signal;
        an integrator is coupled to the first capacitor;
        a pulse width modulator (PWM) that is coupled to the integrator;
        a logic circuit coupled to the PWM; and
        an output stage having:
            a first node;
            a second node;
            a third node;
            a fourth node that is coupled to ground;
            a capacitor that is coupled between the first and second nodes; and
            a switch network that is coupled to the first node, the second node, the third node, the fourth node, and a supply rail, wherein the switch network is controlled by logic circuit so as to operate in first mode, a second mode, and a third mode, and wherein, in the first mode, the voltage supply charges the capacitor and the third node is grounded, and wherein, in the second mode, the capacitor provides a positive supply voltage to the third node, and wherein, in the third mode, the capacitor provides a negative supply voltage in the third mode; and
    a speaker that is coupled to the third node.

7. The apparatus of claim 6, wherein the switch network further comprises:
    a first switch that is coupled between the supply rail and the first node, wherein the first switch is closed in the first mode;
    a second switch that is coupled between the first node and the fourth node, wherein the second switch is closed in the third mode;
    a third switch that is coupled between the first node and the third node, wherein the third switch is closed in the second mode;
    a fourth switch that is coupled between the second node and the fourth node, wherein the fourth switch is closed in the first mode and the second mode;
    a fifth switch that is coupled between the second node and the fourth node, wherein the fifth switch is closed in the third mode;

a sixth switch that is coupled between the third node and the fourth node, wherein the sixth switch is closed in the first mode.

8. The apparatus of claim 6, wherein the input signal is differential.

9. The apparatus of claim 8, wherein the integrator further comprises:
  an amplifier having a first input terminal, a second input terminal, a first output terminal, and a second output terminal; and
  a first feedback capacitor that is coupled between the first input terminal and the first output terminal; and
  a second feedback capacitor that is coupled between the second input terminal and the second output terminal.

10. The apparatus of claim 6, wherein the PWM further comprises:
  a first comparator having a first input terminal, a second input terminal, and an output terminal, wherein the first input terminal of the first comparator is coupled to the integrator, and wherein the output terminal of the first comparator is coupled to the logic circuit;
  a second comparator having a first input terminal, a second input terminal, and an output terminal, wherein the first input terminal of the second comparator is coupled to the integrator, and wherein the output terminal of the second comparator is coupled to the logic circuit; and
  a ramp generator that is coupled to the second input terminal of the first comparator and the second input terminal of the second comparator.

11. An apparatus comprising:
  a supply rail;
  a first node;
  a second node;
  a third node;
  a fourth node that is coupled to ground;
  a first direct current (DC) blocking capacitor that receives a first portion of an input signal;
  a second DC blocking capacitor that receives a second portion of the input signal;
  an amplifier having a first input terminal, a second input terminal, a first output terminal, and a second output terminal, wherein the first input terminal of the amplifier is coupled to the first DC blocking capacitor, and wherein the second input terminal of the amplifier is coupled to the second DC blocking capacitor;
  a first feedback capacitor that is coupled between the first input terminal and the first output terminal;
  a second feedback capacitor that is coupled between the second input terminal and the second output terminal;
  a first comparator having a first input terminal, a second input terminal, and an output terminal, wherein the first input terminal of the first comparator is coupled to the first output terminal of the amplifier;
  a second comparator having a first input terminal, a second input terminal, and an output terminal, wherein the first input terminal of the second comparator is coupled to the second output terminal of the amplifier;
  a ramp generator that is coupled to the second input terminal of the first comparator and the second input terminal of the second comparator;
  a logic circuit coupled to the output terminals of the first and second comparators;
  an output capacitor that is coupled between the first and second nodes;
  a first switch that is coupled between the supply rail and the first node, wherein the first switch is closed by the logic circuit in a first mode;
  a second switch that is coupled between the first node and the fourth node, wherein the second switch is closed by the logic circuit in a second mode;
  a third switch that is coupled between the first node and the third node, wherein the third switch is closed by the logic circuit in a third mode;
  a fourth switch that is coupled between the second node and the fourth node, wherein the fourth switch is closed by the logic circuit in the first mode and the third mode;
  a fifth switch that is coupled between the second node and the fourth node, wherein the fifth switch is closed by the logic circuit in the second mode; and
  a sixth switch that is coupled between the third node and the fourth node, wherein the sixth switch is closed by the logic circuit in the first mode.

12. The apparatus of claim 11, wherein the apparatus further comprises an audio source that is coupled to the first and second DC blocking capacitors so as to provide the input signal.

13. The apparatus of claim 12, wherein the apparatus further comprises a speaker that is coupled to the third node.

* * * * *